(12) United States Patent
Tanaka et al.

(10) Patent No.: US 6,870,623 B2
(45) Date of Patent: Mar. 22, 2005

(54) POSITION DETECTION APPARATUS, ALIGNMENT APPARATUS AND METHODS THEREFOR, AND EXPOSURE APPARATUS AND DEVICE MANUFACTURING METHOD

(75) Inventors: Hiroshi Tanaka, Tochigi (JP); Kazuhiko Mishima, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 85 days.

(21) Appl. No.: 10/244,171

(22) Filed: Sep. 16, 2002

(65) Prior Publication Data

US 2003/0054574 A1 Mar. 20, 2003

(30) Foreign Application Priority Data

Sep. 17, 2001 (JP) ........................................ 2001-282103

(51) Int. Cl.[7] .............................................. G01B 11/00
(52) U.S. Cl. ........................................................ 356/401
(58) Field of Search ................................. 356/399–401; 250/548; 430/5, 22, 30; 355/53, 55

(56) References Cited

U.S. PATENT DOCUMENTS

| | | | |
|---|---|---|---|
| 5,249,016 A | 9/1993 | Tanaka | 355/53 |
| 5,365,342 A * | 11/1994 | Ayata et al. | 356/401 |
| 5,695,897 A * | 12/1997 | Mitome et al. | 430/22 |
| 5,790,258 A * | 8/1998 | Mitome et al. | 356/401 |
| 5,815,594 A | 9/1998 | Tanaka | 382/151 |
| 5,943,135 A | 8/1999 | Mishima | 356/401 |
| 6,151,121 A | 11/2000 | Mishima | 356/399 |
| 6,163,366 A * | 12/2000 | Okamoto et al. | 355/53 |
| 6,335,784 B2 | 1/2002 | Mishima | 355/53 |
| 6,406,820 B1 * | 6/2002 | Ota | 430/30 |
| 6,515,296 B1 * | 2/2003 | Komatsu et al. | 250/559.44 |

* cited by examiner

Primary Examiner—Zandra V. Smith
(74) Attorney, Agent, or Firm—Fitzpatrick, Cella, Harper & Scinto

(57) ABSTRACT

A position detection apparatus for detecting a position of a pattern includes a first sensing system which senses a first image of the pattern at a first magnification, a second sensing system which senses a second image of the pattern at a second magnification higher than the first magnification, and a determination system which determines whether a relative position between the second sensing system and the pattern is valid for detecting a position of the pattern based on the first image sensed by the first sensing system.

28 Claims, 16 Drawing Sheets

POSITION DETECTION APPARATUS, ALIGNMENT APPARATUS AND METHODS THEREFOR, AND EXPOSURE APPARATUS AND DEVICE MANUFACTURING METHOD

FIELD OF THE INVENTION

The present invention relates to a position detection apparatus, an alignment apparatus and methods therefor, and an exposure apparatus and a device manufacturing method using the same.

BACKGROUND OF THE INVENTION

FIG. 11 is a block diagram for explaining the arrangement of a general alignment mechanism used for an exposure apparatus. FIG. 12 is a view showing a wafer on which general alignment marks are formed. FIG. 13 is a flow chart for explaining the schematic procedures for general alignment processing. Wafer alignment by a general semiconductor manufacturing apparatus will be described with reference to these drawings.

If a wafer W is supplied to the semiconductor manufacturing apparatus, a mechanical alignment apparatus MA mechanically aligns the wafer W by using the periphery of the wafer W and an orientation flat or a notch (notch N is shown in FIG. 12 ) to determine the rough position of the wafer W (step S02 ). The mechanical alignment precision is about 20 μm.

Then, the wafer W is set on a chuck CH by a wafer supply apparatus (not shown) (step S03) and pre-aligned (step S04). In pre-alignment, a mirror MM is inserted into an optical path formed by an alignment light source Li and mirror M1 in a scope SC. The mirror MM guides alignment light to a sensor S1 set to a low magnification. In pre-alignment, left and right pre-alignment marks PAL and PAR shown in FIG. 12 are detected using the low-magnification sensor S1, and their mark positions are obtained to attain the center of the wafer. The alignment precision in this pre-alignment is about 4 μm.

Finally, global alignment is performed to accurately obtain the position of the wafer W and the position of an exposure shot (step S05). In global alignment, the mirror MM is removed from the optical path in the scope SC. A sensor S2 set to a high magnification is used to measure the positions of a plurality of global alignment marks FX1 to FX4 and FY1 to FY4 on the wafer W shown in FIG. 12. Global alignment provides X- and Y-direction shifts of the wafer W and the rotational component, and the magnification component of the shot array. The global alignment precision must be 50 nm or less in a machine which manufactures current 256-Mbit memories.

The scope SC shown in FIG. 11 will be explained with reference to FIG. 14. FIG. 14 is a view showing the detailed arrangement of the scope SC.

In FIG. 14, light guided from an illumination light source 401 (fiber or the like) passes through a switching ND filter 415 serving as a beam attenuation means. Then, light is guided to a polarized beam splitter 403 (corresponding to the mirror M1 in FIG. 11) via an illumination optical system 402.

The switching ND filter 415 is made up of ND filters 415a to 415f having a plurality of discrete transmittances. A desired ND filter can be used by driving a rotation driving system 420. A controller 421 controls the rotation driving system 420 to select an ND filter so as to optimize the brightness in accordance with the reflectance of an object to be observed.

The filter is not limited to the switching ND filter. The same structure can also be constituted by rotation of a polarizing plate for a light source such as an He—Ne laser which emits light having a polarization characteristic.

S-polarized light reflected by the polarization beam splitter 403 in a direction perpendicular to the sheet surface of FIG. 14 passes through a relay lens 404 and λ/4 plate (quarter-wave plate) 409. After that, the S-polarized light is converted into circularly polarized light to Köhler-illuminate an alignment mark AM formed on the wafer 6 via an objective lens 405.

Reflected light, diffracted light, and scattered light from the alignment mark AM return to the objective lens 405 and λ/4 plate 409, and are converted into P-polarized light parallel to the sheet surface of FIG. 14. The P-polarized light passes through the polarization beam splitter 403 and forms the image of the alignment mark AM on a photoelectric conversion element 411 (413) (e.g., a CCD camera) via an imaging optical system 410 (412). The position of the wafer 6 is detected based on the position of the photoelectrically converted alignment mark image.

The imaging optical systems 410 and 412 will be described. A switching mirror 414 (corresponding to the mirror MM in FIG. 11), which switches an optical path, is interposed between the polarization beam splitter 403 and the imaging optical system 410 (412). The switching mirror 414 is inserted into an optical path to guide light to the imaging optical system 412 having a low magnification, which allows observing the alignment mark AM on the wafer at a low magnification in a wide region. The switching mirror 414 is removed from the optical path to guide light to the high-magnification detectable imaging optical system 410. The high-magnification imaging optical system 410 makes it possible to detect the alignment mark on the wafer in a narrow region at a high precision.

The controller 421 acquires a wafer position on the basis of information about the photoelectrically converted alignment mark image. The controller 421 sets an optimum one of the ND filters 415a to 415f by issuing a command to the rotation driving system 420 so as to optimize the light quantity in accordance with the brightness and contrast of the alignment mark AM.

At this time, to detect the alignment mark AM on the wafer 6 at high precision, the image of the alignment mark AM must be clearly detected. In other words, the SC must be focused on the alignment mark AM. For this purpose, an AF detection system (not shown) is generally constituted. The alignment mark is driven to the best focus plane of the SC on the basis of the detection result of the AF detection system, thus detecting the alignment mark.

As described above, accurately obtaining the wafer position requires at least pre-alignment and global alignment on the chuck. In pre-alignment, the mark must be detected in a wide field of view after rough alignment by mechanical alignment. The mark must be detected by a low-magnification scope and must be as large as about 100 μm. In global alignment, the mark is precisely detected by a high-magnification scope because the mark has already been aligned with a shift of about 4 μm by pre-alignment.

Regarding measurement by a plurality of detection systems for low magnification (pre-alignment) and high magnification (global alignment), demands are arising for short-time detection and measurement. Since the number of wafers processed per unit time must be increased, the time of processing alignment not accompanied by exposure must be shortened as much as possible.

In addition, a general scope SC for alignment must drive the switching ND filter 415 for an optimum light quantity, and adjust the light quantity to an optimum one (control light), every high/low-magnification detection or in accordance with the reflectance of an alignment mark AM on the wafer. For this reason, it takes a long time to drive the switching ND filter 415, thereby decreasing the throughput in position detection.

SUMMARY OF THE INVENTION

The present invention has been made in consideration of the aforementioned problems, and has as its object to achieve high-speed position detection.

According to the present invention, the foregoing object is attained by providing a position detection apparatus which detects a position of a predetermined pattern, comprising a first sensing system which senses pattern information of the predetermined pattern at a first magnification;

a second sensing system which senses pattern information of the predetermined pattern at a second magnification higher than the first magnification;

acquisition means for causing the first and second sensing systems to acquire signals at the same timing;

first detection means for detecting the position of the predetermined pattern on the basis of a signal obtained from the first sensing system by the acquisition means; and second detection means for detecting the position of the predetermined pattern on the basis of a signal obtained from the second sensing system by the acquisition means.

According to the present invention, the foregoing object is also attained by providing an alignment apparatus for aligning a substrate on which a plurality of alignment marks are formed, comprising a first sensing system which senses pattern information of the predetermined pattern at a first magnification;

a second sensing system which senses pattern information of the predetermined pattern at a second magnification higher than the first magnification;

mark position detection means for detecting a position of an alignment mark using the first and second sensing systems; and alignment means for aligning the substrate on the basis of the position of the alignment mark obtained by the mark position detection means, wherein the mark position detection means comprises acquisition means for causing the first and second sensing systems to acquire signals at the same timing;

first detection means for detecting the position of the alignment mark on the basis of the signal obtained from the first sensing system by the acquisition means; and second detection means for detecting the position of the alignment mark on the basis of the signal obtained from the second sensing system by the acquisition means.

According to the present invention, the foregoing object is also attained by providing a position detection method of detecting a position of a predetermined pattern using a first sensing system which senses pattern information of the predetermined pattern at a first magnification and a second sensing system which senses pattern information of the predetermined pattern at a second magnification higher than the first magnification, comprising the acquisition step of causing the first and second sensing systems to acquire signals at the same timing;

the first detection step of detecting the position of the predetermined pattern on the basis of a signal obtained from the first sensing system in the acquisition step; and the second detection step of detecting the position of the predetermined pattern on the basis of a signal obtained from the second sensing system in the acquisition step.

According to the present invention, the foregoing object is also attained by providing an alignment method of aligning a substrate on which a plurality of alignment marks are formed using a first sensing system which senses pattern information of the predetermined pattern at a first magnification and a second sensing system which senses pattern information of the predetermined pattern at a second magnification higher than the first magnification, comprising the mark position detection step of detecting a position of an alignment mark using the first and second sensing systems; and the alignment step of aligning the substrate on the basis of the position of the alignment mark obtained in the mark position detection step, wherein the mark position detection step comprises the acquisition step of causing the first and second sensing systems to acquire signals at the same timing;

the first detection step of detecting the position of the alignment mark on the basis of the signal obtained from the first sensing system in the acquisition step; and the second detection step of detecting the position of the alignment mark on the basis of the signal obtained from the second sensing system in the acquisition step.

According to the present invention, there are also provided an exposure apparatus using the alignment apparatus, and a device manufacturing method.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will now be described in detail in accordance with the accompanying drawings.

First Embodiment

Figure 1:
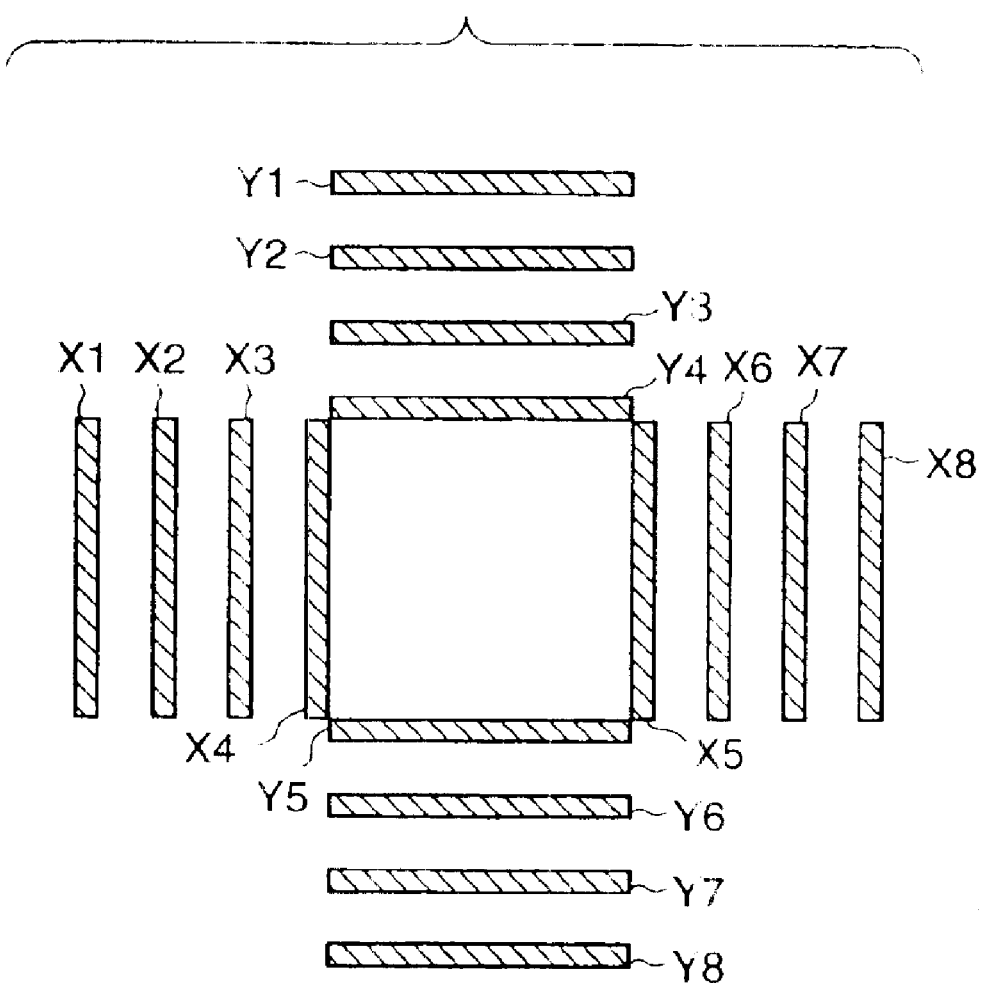
FIG. 1 is a view for explaining an example of an alignment mark usable in an embodiment.

FIG. 1 is a view for explaining an example of an alignment mark usable in the first embodiment. The alignment mark shown in FIG. 1 is made up of eight X-direction measurement marks (X1 to X8) and eight Y-direction measurement marks (Y1 to Y8). This alignment mark can provide the X and Y positions of the mark in pre-alignment measurement and global alignment measurement. In pre-alignment, the two-dimensional arrangement of the 16 measurement marks is recognized by a low-magnification detection system by pattern matching, and X- and Y-direction positions are simultaneously calculated from the mark. In global alignment, the mark position is detected by a high-magnification detection system at higher resolving power than in pre-alignment.

Figure 5A:
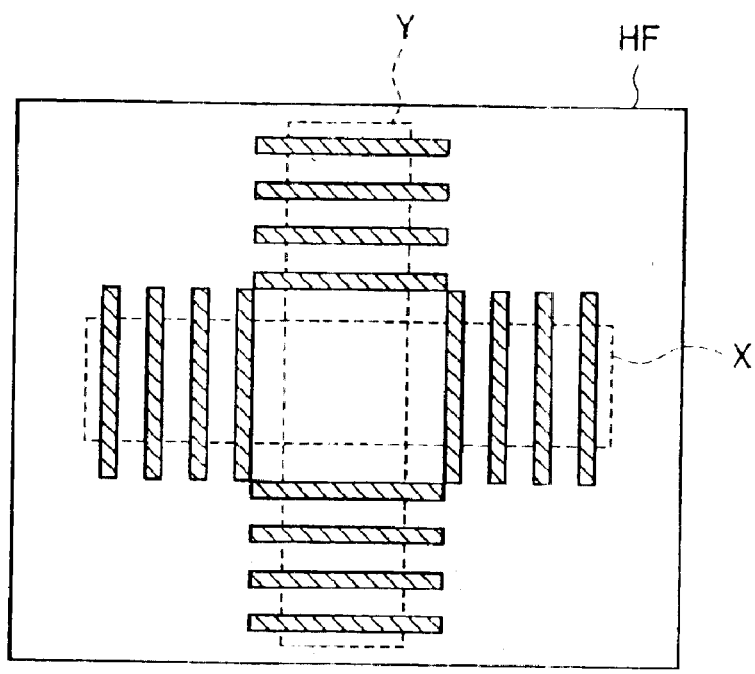
FIGS. 5A and 5B are views showing a state in which the alignment marks of FIG. 1 formed on the scribe line on a wafer are observed via the scope SC.

For example, the mark is observed by the high-magnification detection system, and windows X and Y are established, as shown in FIG. 5A. For each of the windows X and Y, accumulation and projection are performed in a non-measurement direction, i.e., the longitudinal direction of the mark. One-dimensional signals are generated to obtain the barycenter, thereby detecting the X and Y positions of the mark.

Figure 2:
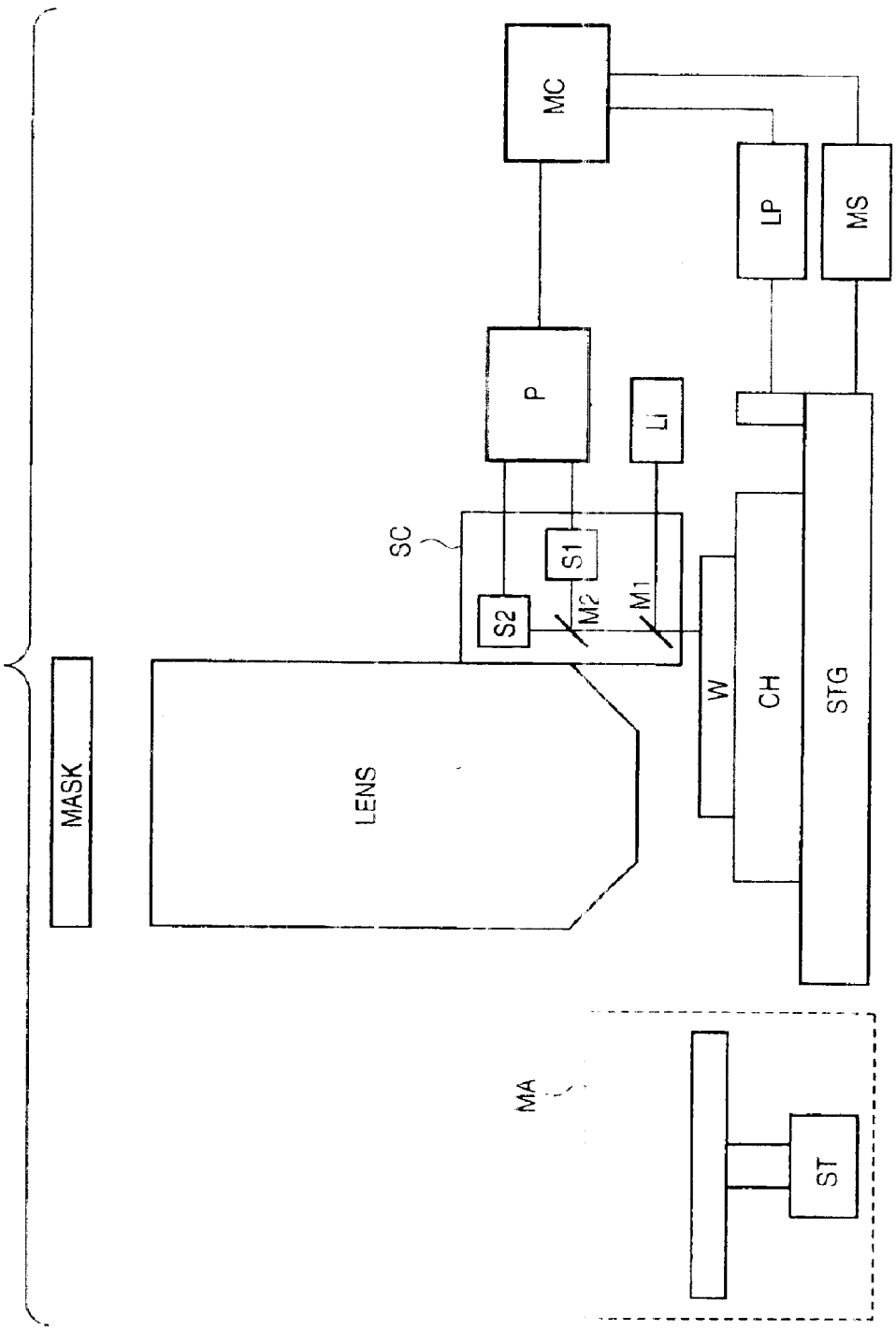
FIG. 2 is a block diagram for explaining the arrangement of an exposure apparatus having an alignment mechanism according to the first embodiment.
Figure 3:
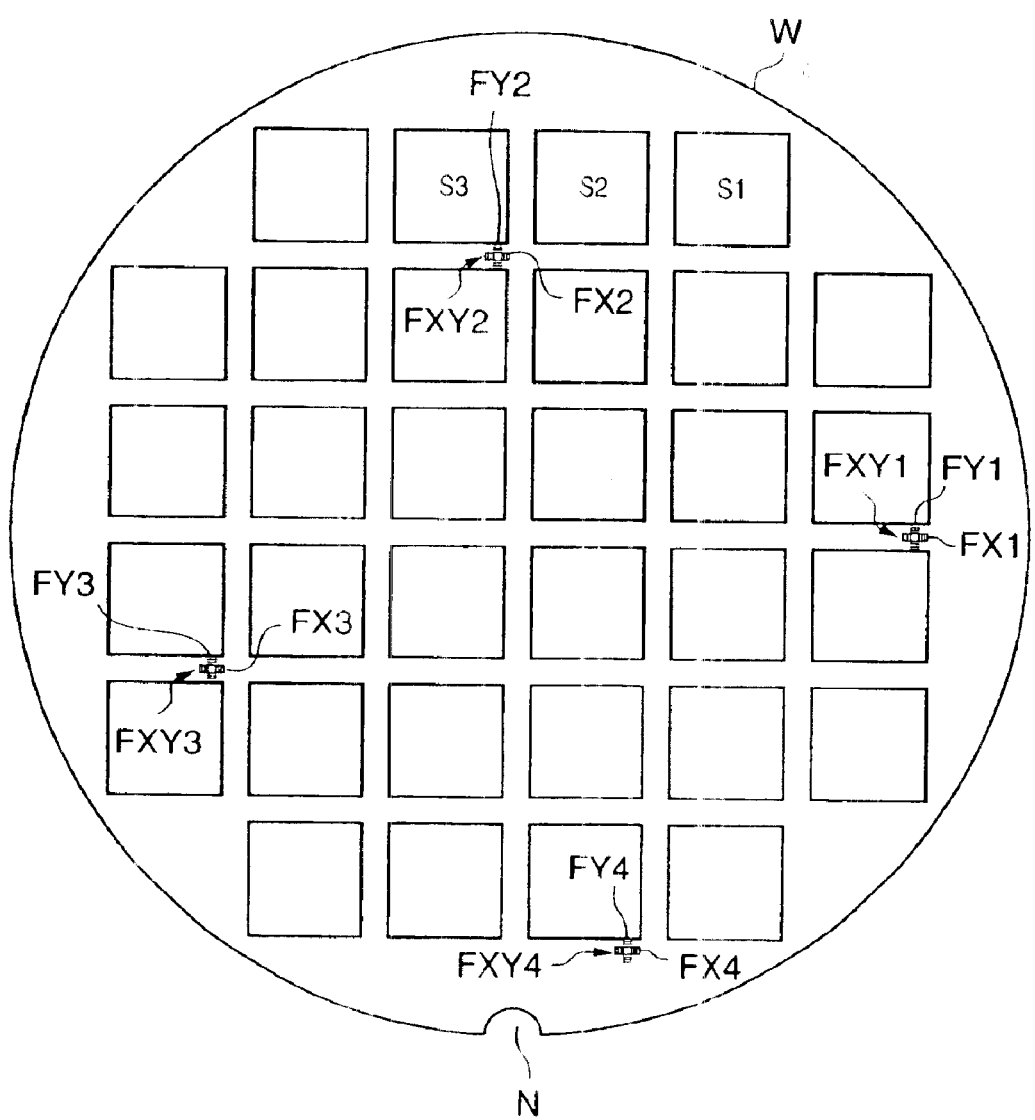
FIG. 3 is a view showing a wafer on which alignment marks (FXY1 to FXY4) in FIG. 1 are formed.
Figure 13:
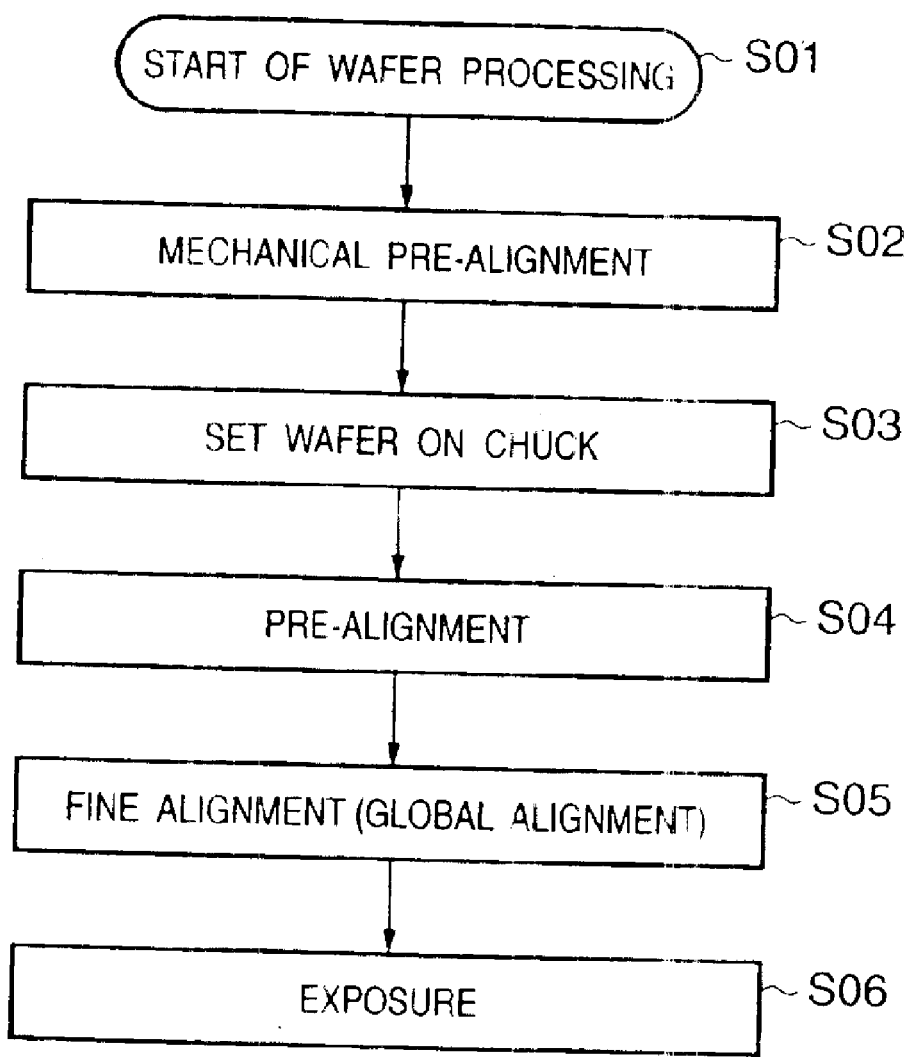
FIG. 13 is a flow chart for explaining the schematic procedures for general alignment processing.
Figure 14:
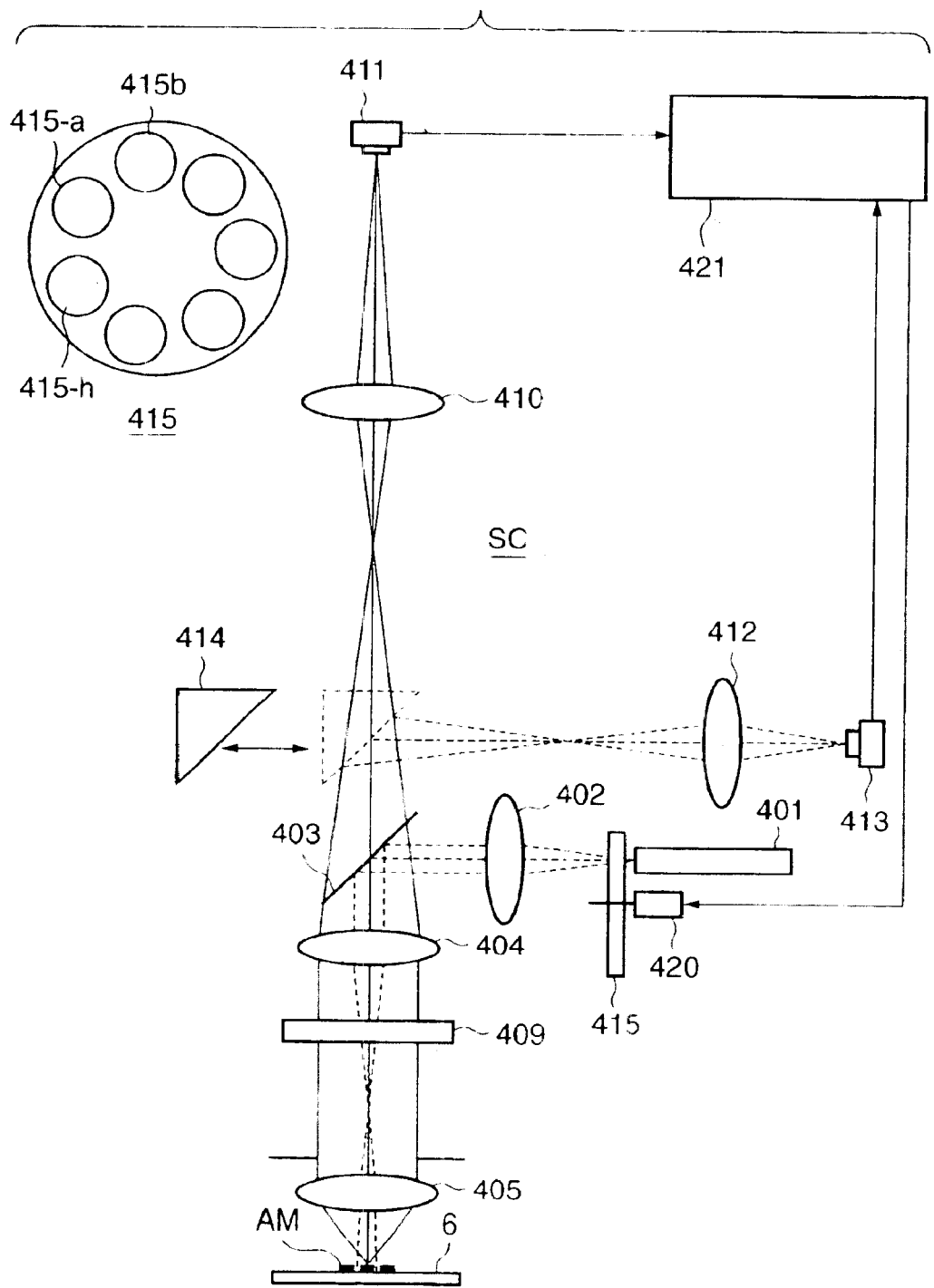
FIG. 14 is a view for explaining the detailed arrangement of a general scope SC.

FIG. 2 is a block diagram for explaining the arrangement of an exposure apparatus having an alignment mechanism of the first embodiment. FIG. 3 is a view showing a wafer on which alignment marks (FXY1 to FXY4) in FIG. 1 are formed. The schematic operation of the alignment mechanism according to the first embodiment will be described with reference to the flow chart of FIG. 13. If a wafer W is supplied to a semiconductor manufacturing apparatus, a mechanical alignment apparatus MA mechanically aligns the wafer W by using the periphery of the wafer and an orientation flat or notch (notch N is shown in FIG. 3) to determine the rough position of the wafer W (step S02). Then, the wafer is set on a chuck CH by a wafer supply apparatus (not shown) (step S03), and pre-aligned by a low-magnification detection system (step S04). Pre-alignment uses a combination of FXY1 and FXY3, or FXY1 and FXY2 shown in FIG. 3. Each mark is sensed using the low-magnification detection system of a scope SC. The mark position is obtained by pattern matching to detect the center of the wafer. The pre-alignment precision is higher as the interval between two marks to be measured is larger. Therefore, if priority is given to the pre-alignment precision, e.g., a combination of FXY1 and FXY3 may be used. On the other hand, if priority is given to the throughput, marks close to each other, e.g., a combination of FXY1 and FXY2 may be used.

Global alignment is performed to accurately obtain the wafer position and exposure shot position (step S05). In global alignment, a plurality of global alignment marks FXY1 to FXY4 on the wafer are measured using a detection system having a higher magnification than in pre-alignment. X- and Y-direction shifts of the wafer W, the rotational component, and the magnification component of the shot array are obtained.

In the above description, pre-alignment and global alignment are completely separated from each other for the sake of convenience. In alignment processing of this embodiment, global alignment is partially executed during pre-alignment measurement. This will be described later.

A scope for observing the mark shown in FIG. 1 simultaneously by low- and high-magnification detection systems will be explained in detail.

The wafer alignment scope SC shown in FIG. 2 allows simultaneously observing a mark at low and high magnifications to detect the mark position. Illumination light is guided from an alignment light source Li into the scope SC, and illuminates an alignment mark on the wafer W via a half-mirror M1 (or polarization beam splitter). For example, light illuminates the mark FXY1 in FIG. 3. Light reflected by the wafer W reaches both high- and low-magnification detection sensors S2 and S1 via the half-mirror M1 and a half-mirror M2. A controller P determines the mark position on the basis of images and signals (pattern information) sensed by the sensors S1 and S2. A main controller MC sends a control signal to a driving unit MS so as to appropriately drive a stage STG on the basis of measurement result information from the controller P, stage position measurement information from a sensor LP, and the like.

Figure 4:
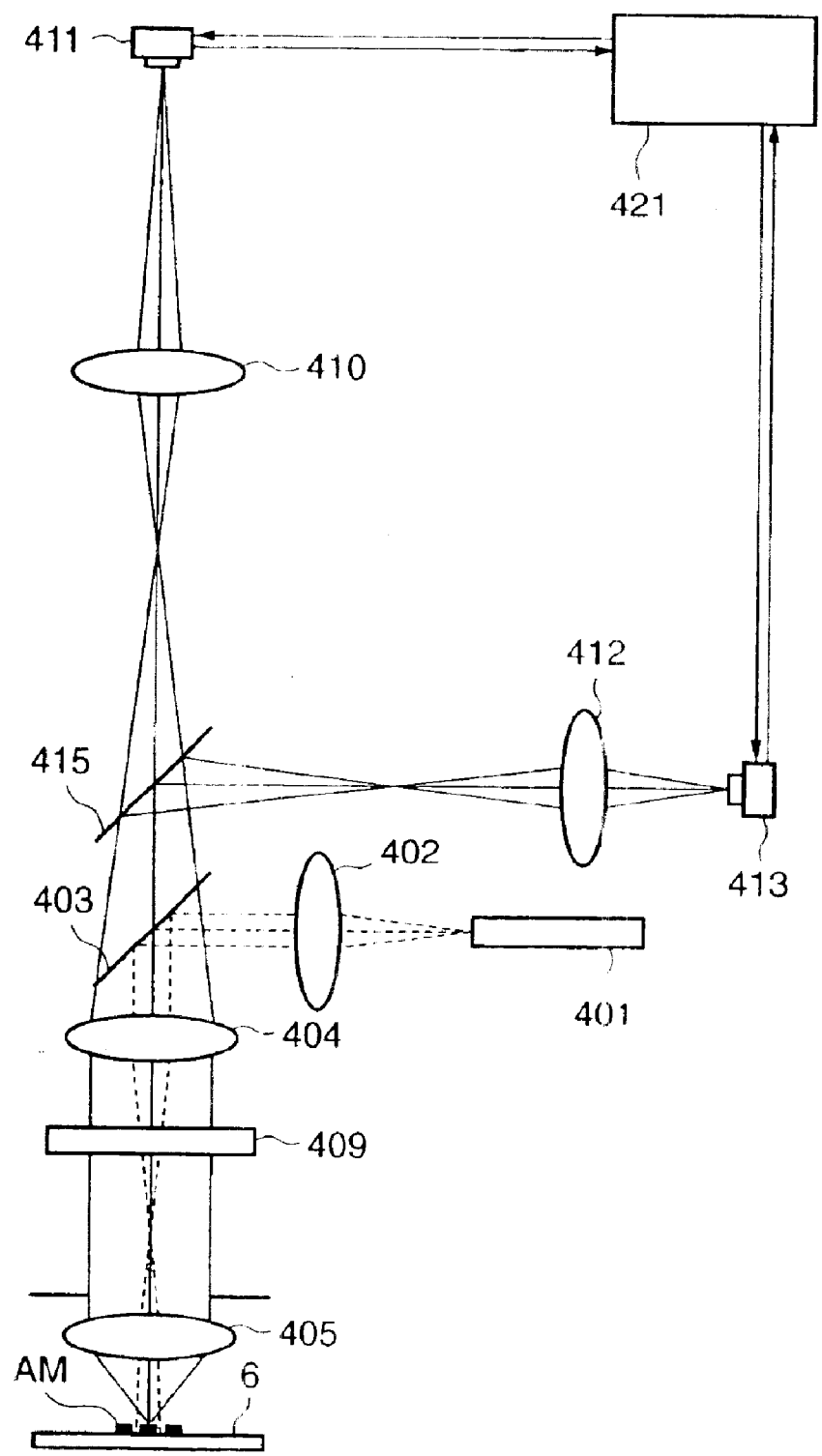
FIG. 4 is a diagram for explaining a scope SC according to the first embodiment in more detail.

FIG. 4 is a diagram for explaining the scope SC shown in FIG. 2 in more detail. In FIG. 4, light guided from an illumination light source 401 (fiber or the like) is guided to a polarization beam splitter 403 (corresponding to the mirror M1 in FIG. 2) via an illumination optical system 402. S-polarized light reflected by the polarization beam splitter 403 to a direction perpendicular to the sheet surface of FIG. 4 passes through a relay lens 404 and λ/4 plate (¼-wavelength plate) 409. After that, light is circularly polarized and Köhler-illuminates an alignment mark AM formed on a wafer 6 via an objective lens 405.

Reflected light, diffracted light, and scattered light from the alignment mark AM on the wafer 6 return through the objective lens 405 and λ/4 plate 409, and are converted into P-polarized light parallel to the sheet surface of FIG. 4. Light split at a proper ratio by a half-mirror 415 (corresponding to the mirror M2 in FIG. 2) forms the images of the alignment mark AM on photoelectric conversion elements 411 and 413 (variable storage time camera) via imaging optical systems 410 and 412, respectively. The controller 421 detects the position of the alignment mark and aligns the wafer 6 based on the position of the photoelectrically converted alignment mark image.

Figure 5B:
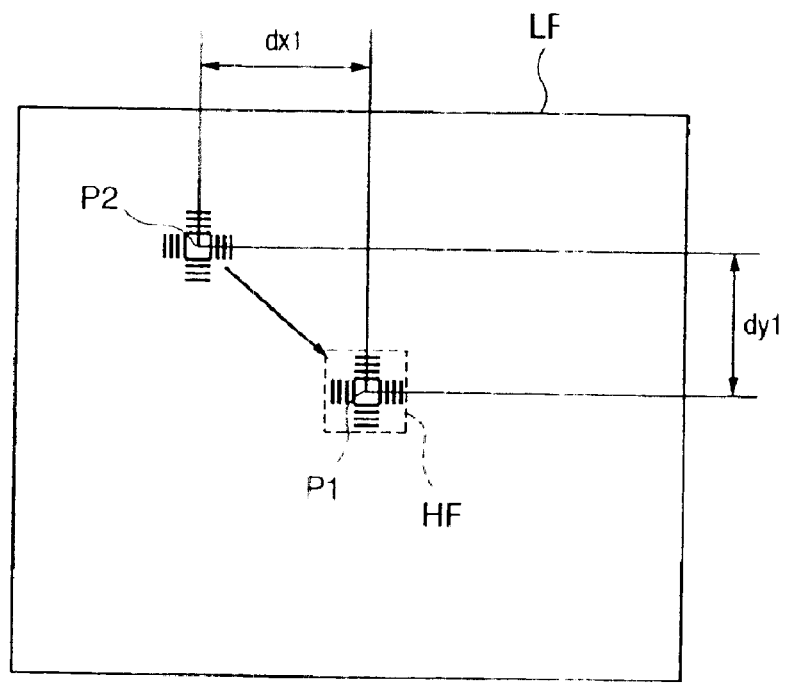

The imaging optical systems 410 and 412 will be described with reference to FIGS. 5A and 5B. FIGS. 5A and 5B are views showing a stage in which the alignment mark of FIG. 1 formed on a scribe line on the wafer is observed via the scope SC. FIG. 5A schematically shows an observation field of view when an alignment mark, which can be measured simultaneously in the X and Y directions, is observed by the high-magnification detection systems 410 and 411. FIG. 5B schematically shows an observation field of view when the same alignment mark is observed by the low magnification detection systems 412 and 413.

FIG. 5B shows a state in which the alignment mark is located at an initial position P2 when the alignment mark is moved to the observation field of view of the scope SC. After the initial position P2 is confirmed, the alignment mark is moved to a detectable region P1 of the high-magnification detection systems 410 and 411, as shown in FIG. 5B. In this case, the low-magnification detection systems 412 and 413 calculate distances dx1 and dy1 from the initial position P2 to the detectable region P1, which will be described later. The wafer stage ("STG" in FIG. 2) is driven based on the calculated distances dx1 and dy1 to move the alignment mark to the detectable region P1. The detectable region P1 means the position and range of a high-magnification detection field HF of view with respect to a low-magnification detection field LF of view. This positional relationship may be adjusted by hardware in advance. Alternatively, the deviation of the center of the high-magnification field of view from that of the low-magnification field of view may be stored as an offset in advance.

The stage STG is so moved as to position the alignment mark in the detectable region P1, and then the X and Y positions are detected by the high-magnification detection systems 410 and 411. A region represented by a broken line in FIG. 5A indicates a measurement window used to measure X and Y positions in global alignment. Accumulation and projection is performed in a non-measurement direction, i.e., the longitudinal direction of the mark. The barycenter can also be detected as image data in the form of a one-dimensional signal.

As described above, the scope SC of the first embodiment enables observing an alignment mark almost simultaneously at low and high magnifications. Control procedures according to the first embodiment (to be described later with reference to the flow charts in FIGS. 7 and 8) can shorten the processing time in alignment measurement.

Figure 6:
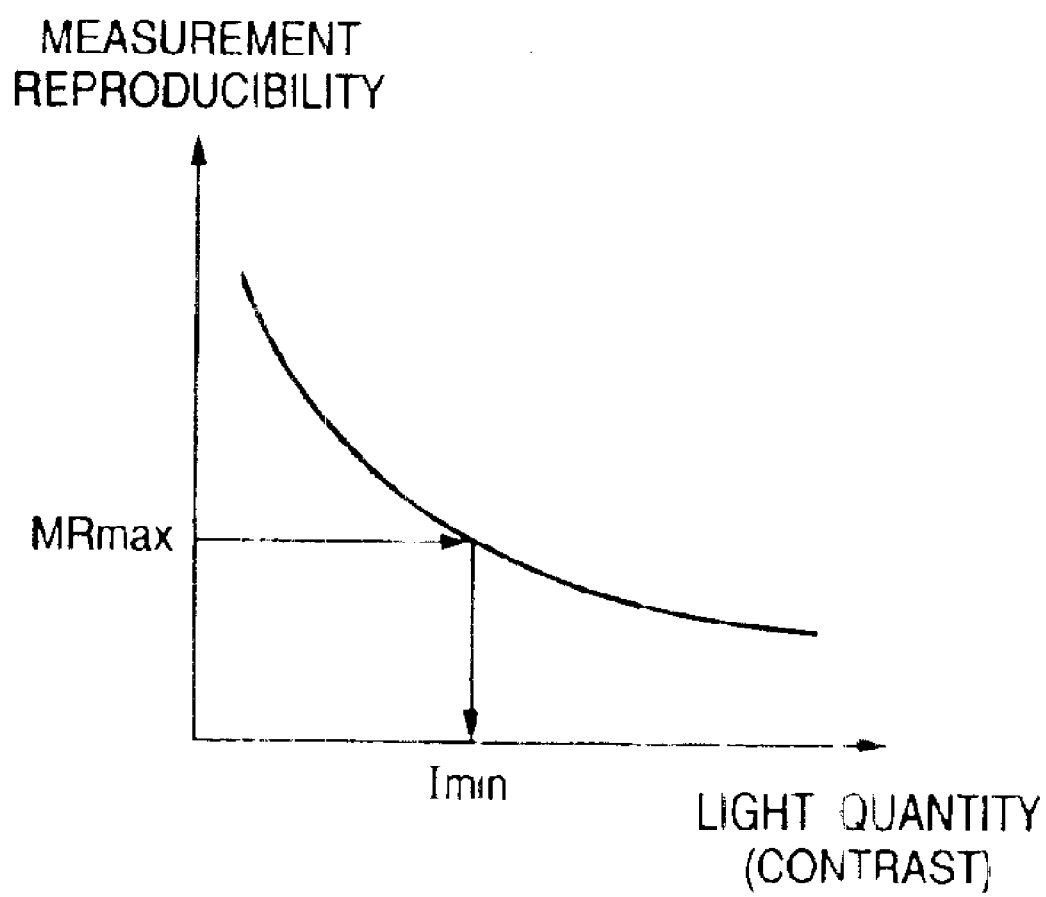
FIG. 6 is a graph showing the relationship between the light quantity and the measurement reproducibility as the light quantity is plotted along the abscissa and the measurement reproducibility along the ordinate.

The relationship between the light quantity of an alignment mark to be detected (or alignment mark signal contrast) and the measurement precision will be described with reference to FIG. 6. FIG. 6 is a graph showing the relationship between the light quantity and the measurement reproducibility by plotting the light quantity (or alignment mark signal contrast) along the abscissa and the alignment mark measurement reproducibility (3σ: higher precision for smaller σ) along the ordinate. As shown in FIG. 6, the measurement reproducibility can be increased by increasing the light quantity or contrast of an alignment mark to be detected. High-precision position detection can be achieved by detecting an alignment mark while maximizing the light quantity so as not to saturate the light quantity. In practice, to compensate for required measurement reproducibility≦MRmax, a minimum value Imin of the light quantity (or contrast) is determined, and the light quantity is so determined as to measure a light quantity of Imin or more (details of which will be described later). In this fashion, the light quantity control (light control) is performed so as to optimize the light quantity for each alignment mark. Light control must be individually performed for low- and high-magnification detection systems. This embodiment executes light control by using a variable storage time camera and setting the optimum storage time in photographing.

In a variable storage time camera, the optimum storage time is set as follows. An alignment mark at the first position on a wafer is detected by the photoelectric conversion elements 411 and 413, and the detected alignment mark signals are sent to the controller 421 (corresponding to the controller P). The controller 421 calculates storage times optimum for the photoelectric conversion elements 411 and 413, and outputs the storage time information to the photoelectric conversion elements 411 and 413. In detecting an alignment mark, the photoelectric conversion elements 411 and 413 sense and measure the alignment mark for the set storage times, thereby measuring the alignment mark with the optimum light quantities. A method of calculating the optimum storage time will be described. Letting I be the light quantity obtained in a certain storage time t0, and Itarget be the target light quantity, the optimum storage time can be obtained by t=[Itarget/I]×t0. The optimum storage time is not limited to this equation and can be calculated by another equation. In short, the storage time suffices to fall within the tolerance.

Calculation of the storage time is preferably performed by obtaining an optimum light quantity every time a signal subsequent to the signal of the alignment mark at the first position is detected. Considering an actual process wafer, light quantities (wafer reflectances) obtained from the wafer are almost the same in the same process. A given tolerance (allowance) set for the light quantity can decrease the storage time resetting frequency. Thus, the time taken to set the storage time can be substantially ignored.

In some cases, even the photoelectric conversion elements 411 and 413 adjusted to have the same light quantity by a design value suffer different light quantities between high and low magnifications on a wafer during an actual process. This is because an actual element pattern other than an alignment mark exists in the observation region of FIG. 5B. In the observation field of view for a high-magnification detection system in FIG. 5A, the light quantity can be determined by only the alignment mark. In the observation field of view for a low-magnification detection system in FIG. 5B, when a region (actual element region) around the alignment mark is bright, light control must be done including this bright region. Therefore, the storage times of the photoelectric conversion elements are desirably optimized individually for low- and high-magnification detection systems.

Next, high-speed wafer alignment processing, which uses the alignment marks shown in FIGS. 1 and 3, and the alignment mechanism shown in FIGS. 2 and 4, will be described.

Part of light which is split by the half-mirror 415 and passes through it forms an image of an alignment mark AM on the photoelectric conversion element (variable storage time camera) 411 via the high-magnification imaging optical system 410. On the other hand, the other part of light split by the half-mirror 415 is guided to the photoelectric conversion element (variable storage camera) 413 via the low-magnification imaging optical system 412 to form an image of the alignment mark AM on the photoelectric conversion element 413. That is, images of the alignment mark AM are simultaneously formed on the two photoelectric conversion elements 411 and 413. Since alignment mark images are simultaneously formed on the photoelectric conversion elements 411 and 413 of the high- and low-magnification detection systems, respectively, an alignment mark image whose position can accurately be detected will be formed on the photoelectric conversion element 411 of the high-magnification detection system if the shift amounts dx1 and dy1 shown in FIG. 5B fall within the tolerance.

In this case, respective light quantities are obtained from two images captured simultaneously to acquire the respective storage times. The controller 421 calculates the light quantities and optimum storage times. In addition, when the shift amounts dx1 and dy1 fall within the tolerance, the calculation result of the alignment mark position obtained using a signal on the high-magnification detection system side generated from the captured alignment mark image is valid. The tolerance means a range of shift amounts, and if shift amounts fall within the range, it is determined that the mark is located in the windows X and Y. Therefore, shift amounts dx1 and dy1 obtained by low-magnification measurement fall within the tolerance, and the high-magnification detection position can be determined in the shortest time.

Figure 7:
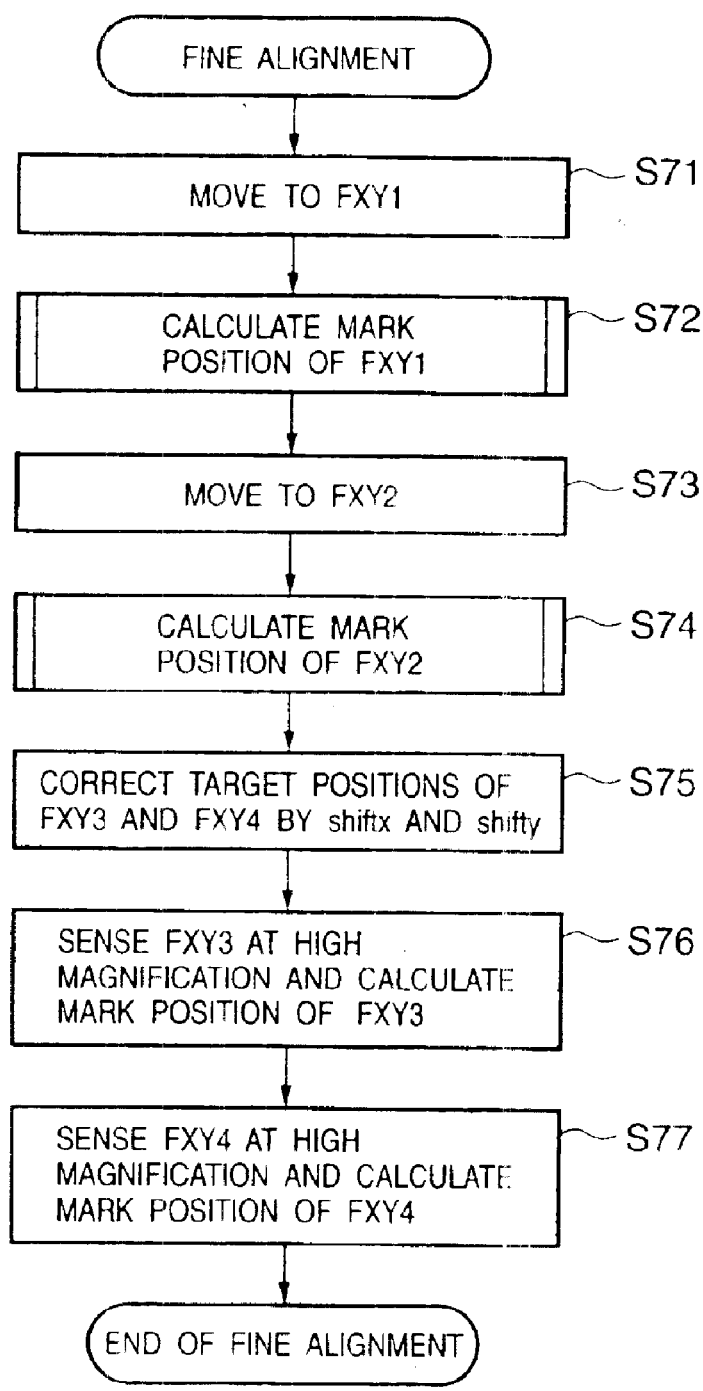
FIG. 7 is a flow chart for explaining alignment processing according to the first embodiment.
Figure 8:
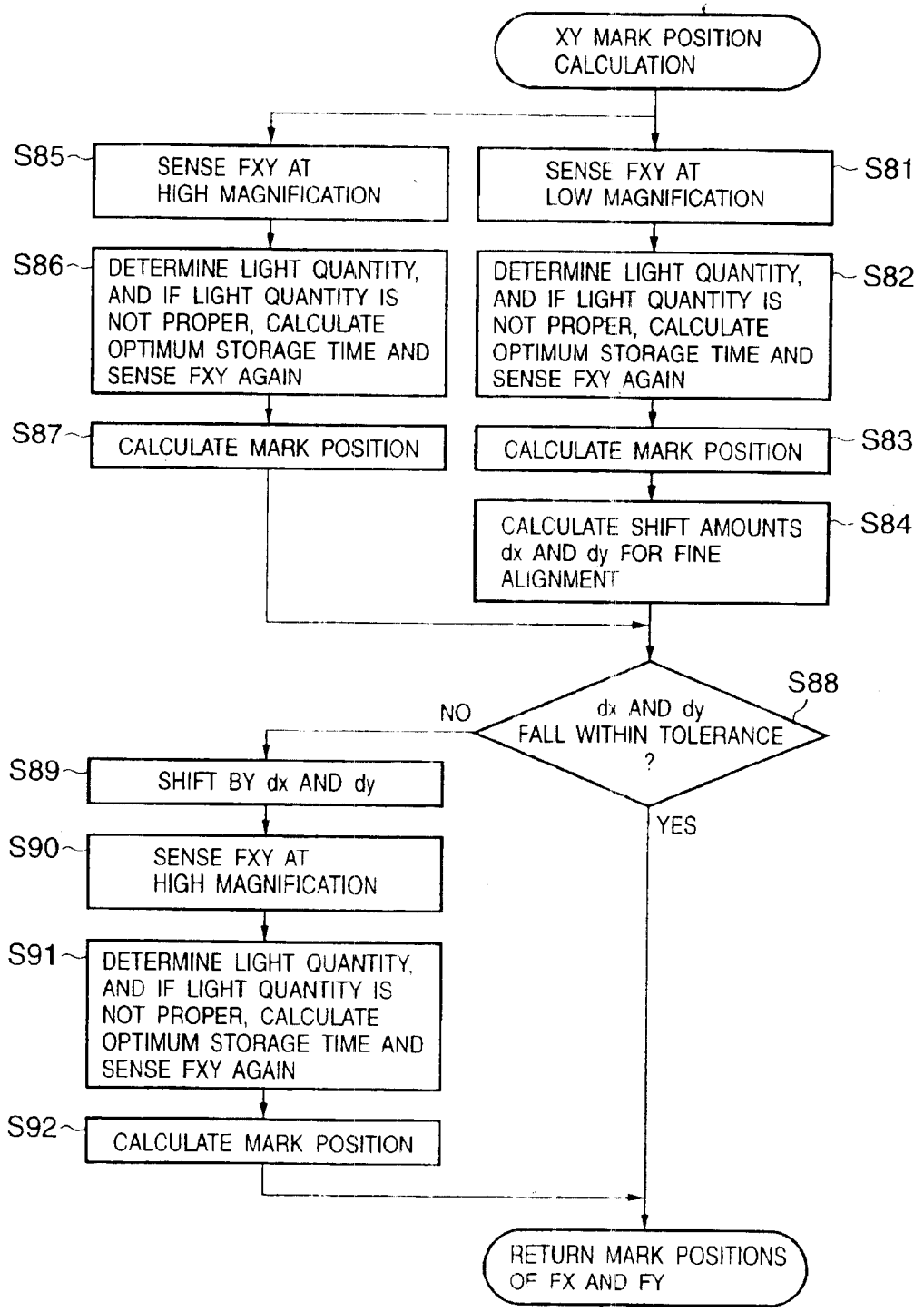
FIG. 8 is a flow chart for explaining alignment processing according to the first embodiment.

Then, alignment processing according to the first embodiment will be explained with reference to the flow charts in FIGS. 7 and 8. The schematic flow of wafer exposure is similar to that in steps S01 to S06 shown in FIG. 13. In the first embodiment, pre-alignment and fine alignment in steps S04 and S05 are combined into fine alignment processing shown in FIG. 7.

When fine alignment starts, the wafer is first moved to the position of the first measurement mark FXY1 (step S71). Note that in this embodiment, two marks FXY1 and FXY2 in FIG. 3 are used in pre-alignment. For the first measurement mark FXY1, low- and high-magnification detection operations are performed to obtain the mark position (step S72).

The procedures for obtaining the mark position by low- and high-magnification detection operations will be described below with reference to FIG. 8. High- and low-magnification image sensing operations are simultaneously performed by the mechanism described with reference to FIG. 4 using the two photoelectric conversion elements 411 and 413 (steps S85 and S81). Each image sensing is performed for a storage time which is set in advance or used for preceding wafers. Then, the light quantity for each image sensing is individually measured to determine whether a required quantity of light is retained for measurement or not. If it is determined that the light quantity exceeds the tolerance, the storage time is set again to sense the image of an alignment mark again (steps S86 and S82). Then, mark position calculation is performed for the captured image (steps S87 and S83).

In an image captured by the high-magnification detection system, the mark may not be sensed properly, and still, the calculation of the mark position needs to be performed. On the other hand, in the low-magnification detection system, an image is sensed in a range wide enough to contain the mark, and the mark position can be obtained. When the mark position is obtained at a low magnification, mark shift amounts dx and dy are determined for fine measurement (step S84). If these shift amounts dx and dy are distances small enough to skip movement of the stage for fine measurement, i.e., they fall within the tolerance, accurate position calculation can be performed for the image of an alignment mark sensed by the high-magnification detection system. Accordingly, the mark positions (X- and Y-direction positions) of FXY calculated in step S87 are adopted, and position detection of the mark ends (step S88).

On the other hand, if the shift amounts dx and dy exceed the tolerance, the alignment mark is not properly sensed by the high-magnification detection system. The stage is shifted by dx and dy (step S89), and high-magnification image sensing is performed again (steps S90 to S92). More specifically, the mark FXY is sensed by the high-magnification detection system (step S90). The light quantity is measured to determine whether a required amount of light is retained for measurement or not. If the light quantity falls outside the tolerance, the storage time is set again to sense the image of the alignment mark again (step S91). Mark position calculation is performed for the captured image to obtain the X- and Y-direction positions of the mark FXY (step S92).

Referring back to FIG. 7, the wafer moves to the second alignment mark FXY2 (step S73). For the second mark FXY2 as well, low- and high-magnification measurements are necessary, and the processing described with reference to FIG. 8 is performed for FXY2. More specifically, low- and high-magnification measurements are simultaneously performed for FXY2 to obtain the mark position (in the X and Y directions). The pre-alignment precision is higher as the interval between two marks to be measured is larger. In the processing of FIG. 7, FXY1 and FXY2 are used to decrease the movement amount of the stage, thereby increasing the throughput.

To calculate the positions of the third and fourth marks FXY3 and FXY4, the deviation shift X and shift Y of the target positions of the marks FXY3 and FXY4, the rotational component $\theta$, and wafer magnification component Mag are obtained from the X- and Y-direction positions of the marks FXY1 and FXY2 (step S75). The shift X, shift Y and rotational component $\theta$ represent a shift amount in setting the wafer on the chuck CH. The wafer magnification Mag represents an extension of a shot pattern on the wafer. If the shift amount and extension are large, the mark cannot be moved to a position immediately below the alignment scope even by moving the wafer directly to the positions of the third and fourth marks FXY3 and FXY4. For this reason, the shot layout of the wafer and the shift of the stage coordinate system are calculated on the basis of the amounts of $\theta$, Mag, shift X, and shift Y. That is, the fine correction amount, by which the grating of the wafer is corrected to be aligned with that of the stage, is obtained.

When the third and fourth marks are shifted to the alignment scope position of the high-magnification detection system, the fine correction amount is reflected. This makes it possible to directly locate the third and fourth marks in the field of view of the high-magnification detection system without processing by the low-magnification detection system, thereby enabling direct observation by the high-magnification detection system.

At this time, $\theta$ may be corrected by rotating the chuck CH, on which the wafer is set, or the stage STG. Since rotation may increase the wafer processing time, in the first embodiment, rotation is not desirably performed.

In the above manner, measurements of the first to fourth marks are complete, and wafer alignment is complete.

As described above, according to the first embodiment, a mark which can be measured both in pre-alignment and global alignment is employed, thereby allowing simultaneous observation of the single mark at low and high magnifications. Thus, the time of alignment processing can be shortened, thus increasing the number of wafers processed per unit time.

In addition, light control can be performed without a driving system such as a switching ND filter provided in the alignment scope SC, and thus, the driving time of the driving system can be saved. For this reason, the detection time of the alignment mark AM can be reduced, thereby increasing the throughput.

An alignment mark is simultaneously image sensed both by the low- and high-magnification detection systems, and it is determined in accordance with the measurement result obtained by the low-magnification detection system whether the image obtained by the high-magnification detection system is valid or not. If it is valid, the position obtained by using the mark image captured by the high-magnification detection system at the same time is adopted as the fine measurement result. This greatly increases the throughput.

Second Embodiment

Figure 9:
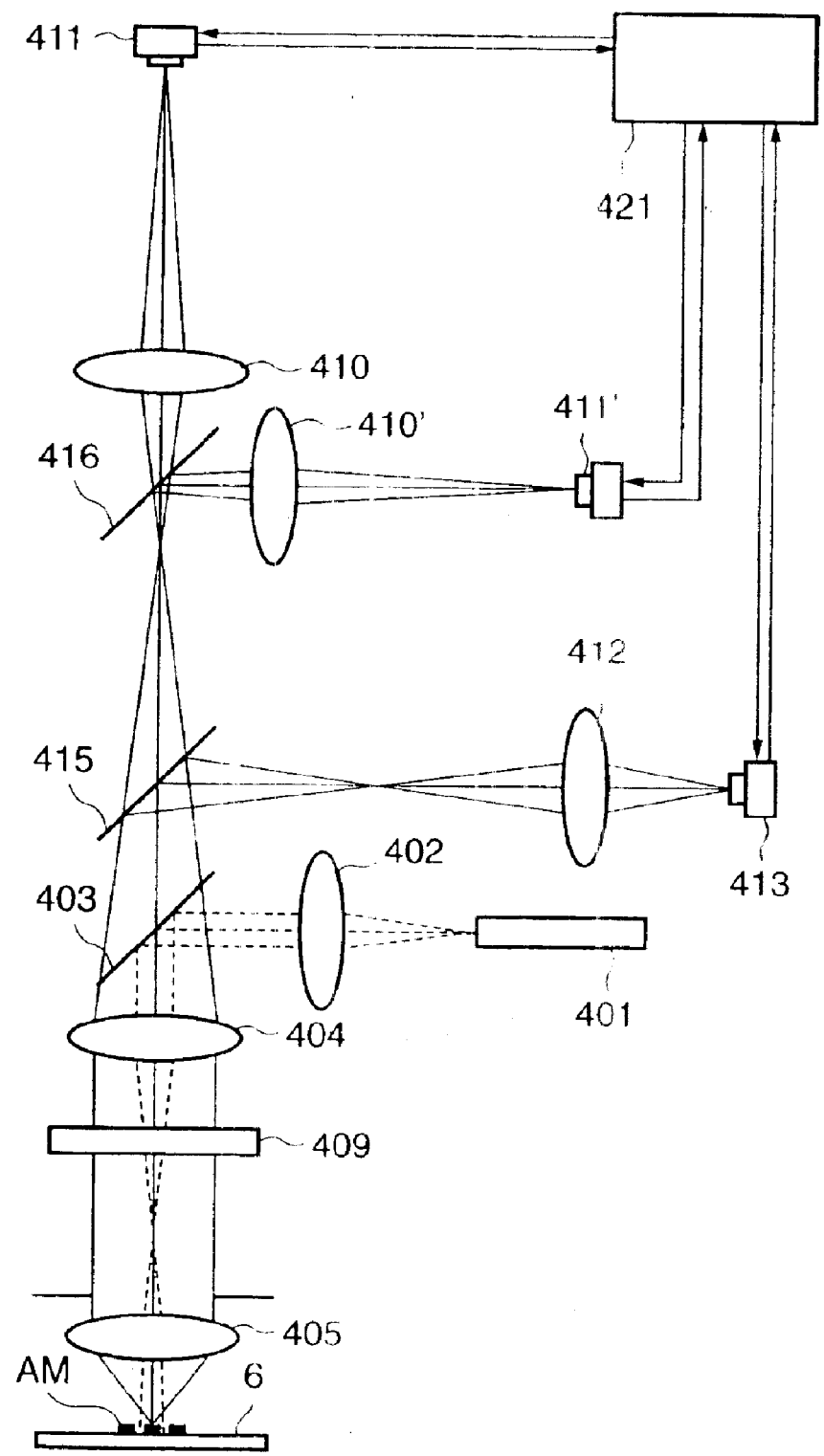
FIG. 9 is a diagram for explaining a scope SC according to the second embodiment in more detail.

Another embodiment of the alignment scope will be described with reference to FIG. 9. The alignment scope of FIG. 9 is different from that of FIG. 4 in that the high-magnification detection system constitutes X and Y independent detection systems (410 and 411, and 410' and 411'). Since the remaining arrangement in FIG. 9 is the same as that in FIG. 4, a detailed description thereof will be omitted, and only the difference will explained.

Light, which is split by a half-mirror 415 and passes through it, is split into two by a second half-mirror 416 arranged on the high-magnification detection system side. Light reflected by the half-mirror 416 is guided to the photoelectric conversion element (variable storage time camera) 411' via the high-magnification detection imaging optical system 410' dedicated for X measurement, and forms the image of an alignment mark AM on the element. Light having passed through the half-mirror 416 is guided to the high-magnification detection imaging optical system 410 dedicated for Y measurement, and forms the image of the alignment mark AM on the variable storage time camera 411, similar to the X measurement. In either case, the position of the alignment mark AM is calculated on the basis of a signal photoelectrically converted by the photoelectric conversion element, which is the same as the above-described embodiment.

Also, similar to the above-described embodiment, image signals obtained from the photoelectric conversion elements 411 and 411' are sent to a controller 421, and the controller 421 calculates an optimum storage time from the signal intensities. The photoelectric conversion elements 411 and 411' can sample image data on the basis of the optimum storage time calculated by the controller 421.

Note that, since it is sufficient that the photoelectric conversion element 411 (411') only has to have a function that it is possible to sense the X region and the Y region of FIG. 5A, photoelectric conversion element 411 (411') may be a linear sensor. In this case, the position of the mark can be calculated by processing alignment signals of X and Y.

Providing detection systems individually for X and Y measurements allows accurate measurement even when the light quantities are different between X and Y measurement marks. For example, in FIG. 5A, the mark is expressed on the assumption that X and Y measurement marks have the same brightness. These X and Y measurement marks may exhibit different brightness levels when, for example, they are formed on the wafer W by different processes. With the arrangement shown in FIG. 9, the storage times of the photoelectric conversion element 411' for X mark detection and photoelectric conversion element 411 for Y mark detection of the high-magnification detection system are individually optimized, thereby allowing preferable alignment mark measurement.

The storage times of respective photoelectric conversion elements can be set even when different optimum storage times are required in the X and Y directions. The switching ND filter need not be switched between X and Y, and the throughput can be increased.

In the above-described arrangement, the X-measurement position of the alignment mark is obtained by the high-magnification detection systems (410' and 411') dedicated for X measurement, and the Y-measurement position of the alignment mark by low-magnification detection systems (410 and 411) dedicated for Y measurement. As in the first embodiment, the X-measurement position of the alignment mark is obtained by the low-magnification detection systems (412 and 413). At this time, images of the alignment mark AM are formed simultaneously on the three photoelectric conversion elements 411', 411, and 413. If the shift amounts dx1 and dy1 shown in FIG. 5B, which are obtained by the low-magnification detection system, fall within the tolerance, the images of the alignment mark AM formed on the photoelectric conversion elements 411 and 411' of the high-magnification detection system can be used to accurately measure the position of the alignment mark AM.

More specifically, the controller 421 determines the light quantity and storage time for each of the three images captured simultaneously and calculates the position on the basis of each image. If the shift amounts dx1 and dy1 fall within the tolerance, the calculation result of the alignment mark position by the high-magnification detection system using the alignment mark captured at that time is valid. Note that the tolerance means a range of shift amounts, and if shift amounts fall within the range, it is determined that the mark is located in the windows X and Y. Therefore, shift amounts dx1 and dy1 obtained by low-magnification measurement fall within the tolerance, and the high-magnification detection amount can be determined in the shortest time.

Next, alignment processing according to the second embodiment will be described with reference to the flow charts shown in FIGS. 7 and 10. The processing shown in FIG. 7 has been described, and a description thereof will not be repeated. In steps S72 and S74, the processing shown in FIG. 10 is executed.

Figure 10:
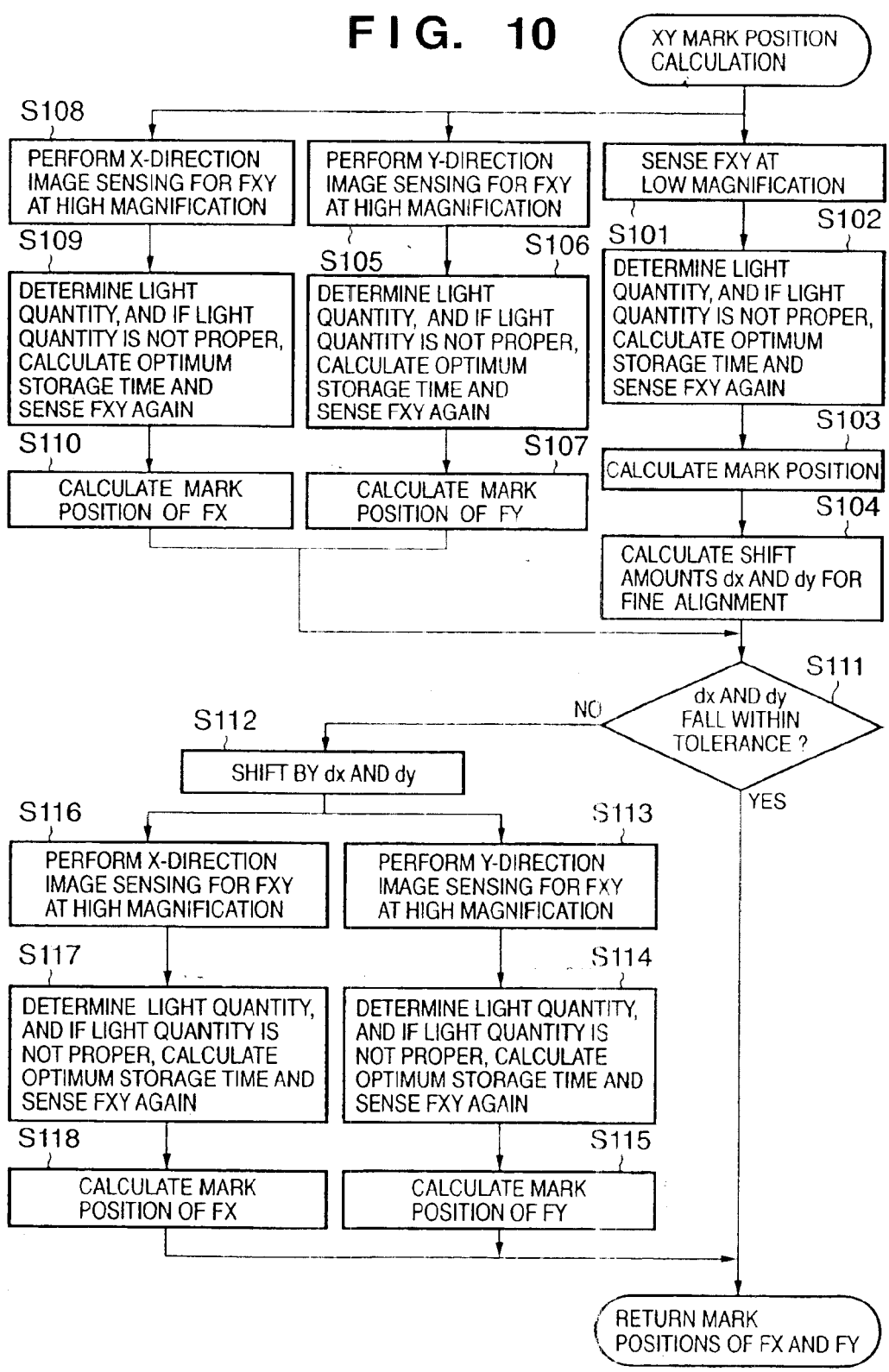
FIG. 10 is a flow chart for explaining alignment processing according to the second embodiment.
Figure 11:
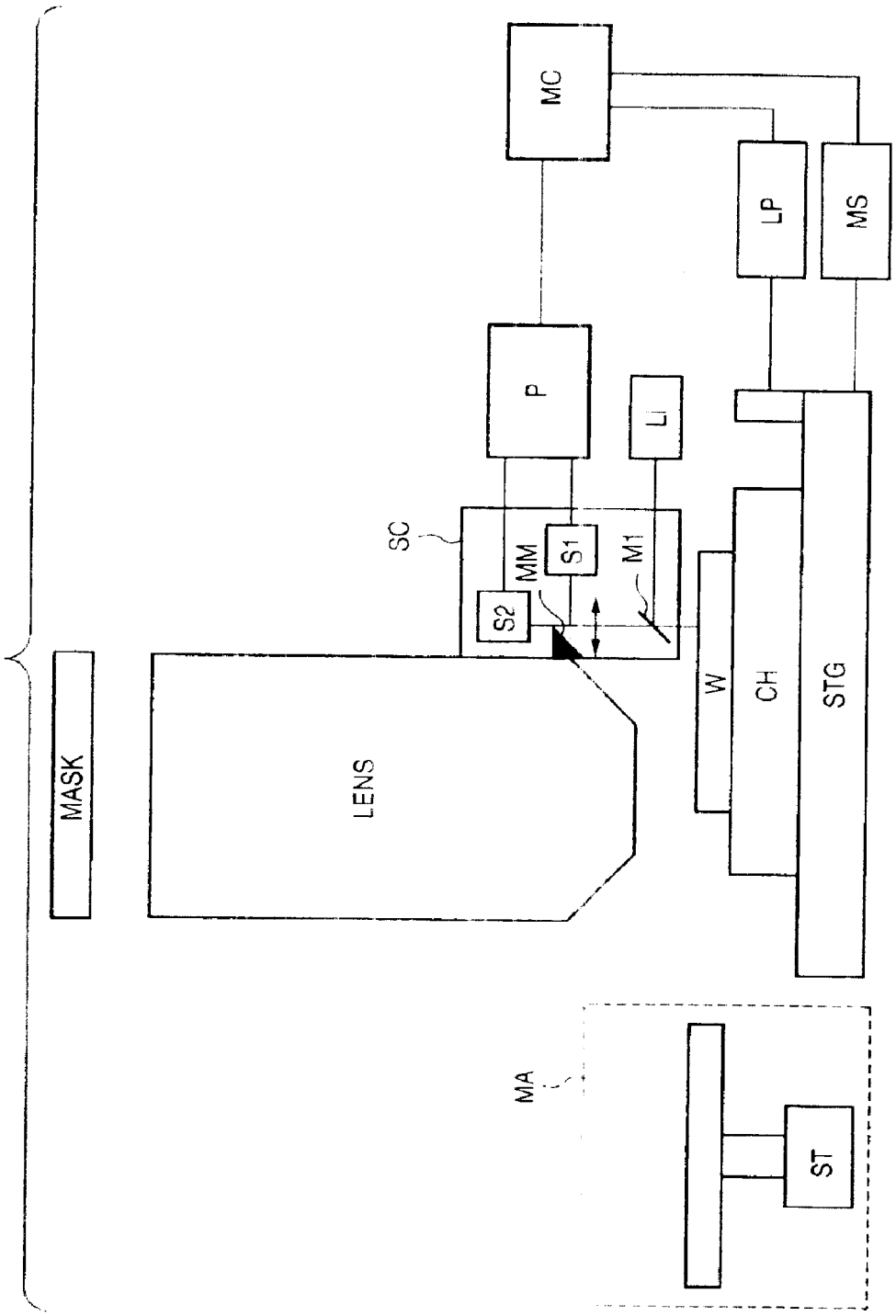
FIG. 11 is a block diagram for explaining the arrangement of a general alignment mechanism used for an exposure apparatus.
Figure 12:
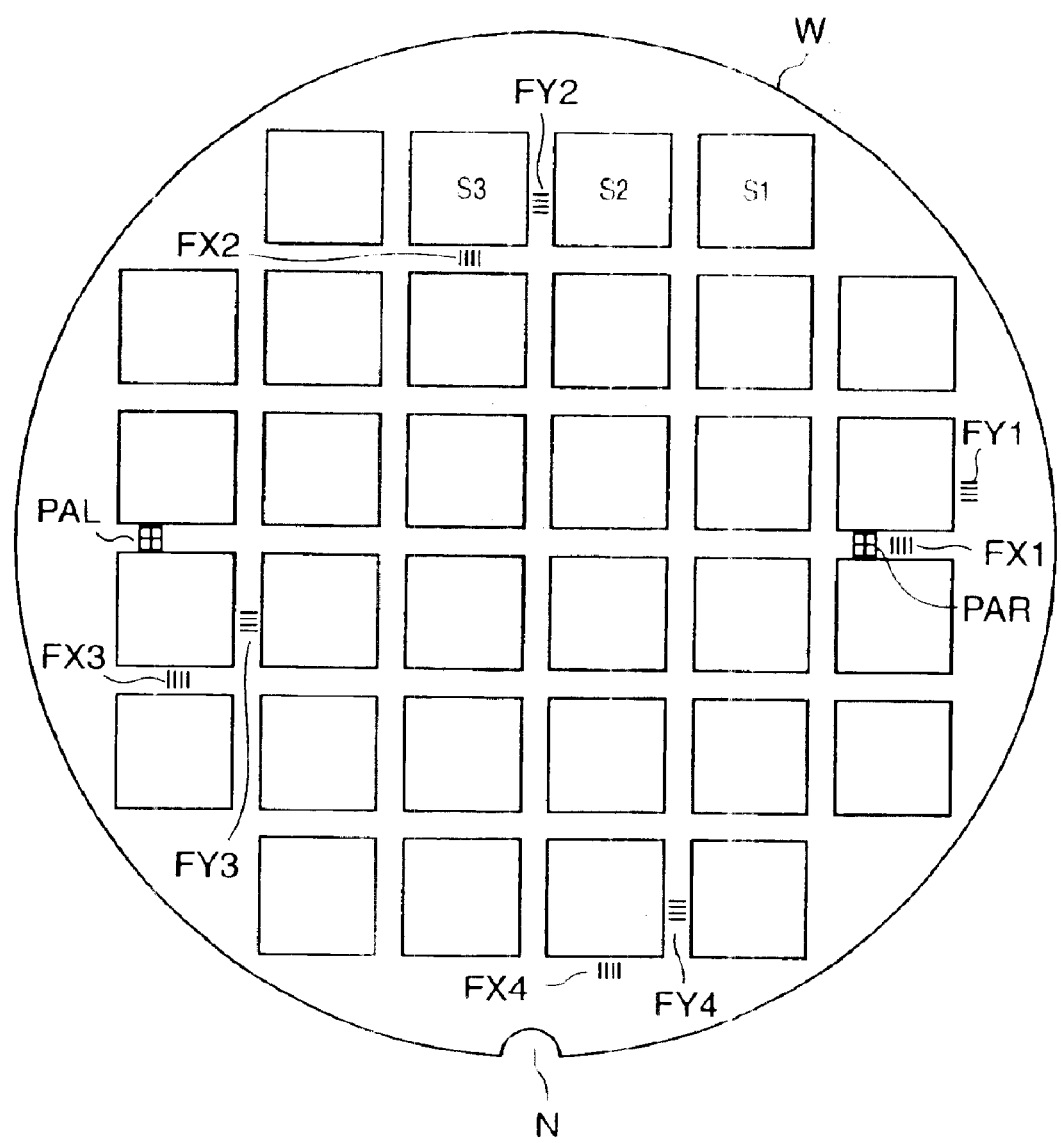
FIG. 12 is a view showing a wafer on which a general alignment mark is formed.

In FIG. 10, low-magnification image sensing by the low-magnification detection systems 412 and 413, high-magnification image sensing by the high-magnification detection systems (410' and 411') for X measurement, and high-magnification image sensing by the high-magnification detection systems (410 and 411) for Y measurement are simultaneously performed (steps S101, S108, and S105). Each image sensing is performed for a storage time which is set in advance or used for preceding wafers. Then, the light quantity for each image sensing is individually measured to determine whether a required quantity of light is retained for measurement, i.e., the light quantity falls within a predetermined range or not. If it is determined that the light quantity falls outside the predetermined range, the storage time is set again to sense the image of an alignment mark again (steps S102, S109, and S106). Calculation of each mark position is performed for the captured image. At this time, the mark may not be sensed properly by the high-magnification detection system, and still, the calculation of the mark position needs to be performed (steps S103, S110, and S107).

In the low-magnification detection system, an image is sensed in a range wide enough to contain the mark in the field of view, and the mark position can be obtained. When the mark position is obtained by the low-magnification detection system, mark shift amounts dx and dy are calculated for fine measurement (step S104). If these shift amounts dx and dy are distances small enough to skip movement of the stage for fine measurement, i.e., they fall within the tolerance, accurate position detection can be performed for the image of the alignment mark sensed using the high-magnification detection system in steps S105, S106, S108, and S109. Accordingly, the FX mark and FY mark positions calculated in steps S110 and S107 are adopted, and mark position detection processing ends (step S111).

On the other hand, if the shift amounts dx and dy exceed the tolerance, the alignment mark is not properly sensed by the high-magnification detection system. The stage is shifted by the calculated shift amounts dx and dy (step S112), and image sensing is performed again by the high-magnification detection system (steps S113 and S116). Determination of the light quantity, setting of the optimum storage time, and mark position detection are performed to determine the mark positions of FX and FY (steps S117, S118, S114, and S115).

As has been described above, according to the second embodiment, dedicated high-magnification detection systems are provided both for X and Y directions, thereby enabling reliable and high-precision position measurement.

The arrangement shown in FIG. 1 has been described by exemplifying an off-axis alignment semiconductor manufacturing apparatus. This arrangement can be applied to any type such as the TTL alignment type or the TTR alignment type in which a wafer mark is observed through a reticle (mask) as far as a scope capable of observing a mark simultaneously at low and high magnifications is used and the mark can be shared by pre-alignment and global alignment.

Third Embodiment

In step S91 in the first embodiment and steps S114 and S117 in the second embodiment, light control and image sensing may be performed again. In the third embodiment, higher-speed alignment measurement is achieved by omitting light control and image sensing in these steps. Note that as the basic hardware arrangement, alignment marks, and the flow of measurement of the third embodiment, those from either of the first and second embodiments may be adopted.

In the third embodiment, a mark position is calculated using a low-magnification detection system, and in addition, the light quantity in each of window X and Y regions, within which high-magnification measurement is performed, is examined using an image sensed at a low magnification to calculate the storage time to be set in high-magnification detection. For example, in step S84 of the flow chart in FIG. 8 and step S104 of the flow chart in FIG. 10, the storage time in high-magnification measurement is calculated to be set to a photoelectric conversion element in advance. Of course, in step S89 or step S112, the storage time may be calculated while the position is shifted by dx1 and dy1 to set the storage time to a photoelectric conversion element of a high-magnification detection system.

In this manner, light quantity measurement at a high magnification and calculation of the storage time are performed using an image captured at a low magnification, thereby omitting processing such as checking of the light quantity and the like in steps S91, S114 and S117. Accordingly, images captured in steps S90, S113 and S116 are immediately used for position calculation in steps S92, S115, and S118. According to the above-described method of the third embodiment, the speed of light control processing is increased, thereby increasing the throughput.

As has been described above, according to the embodiments, by using a mark which can be shared by global alignment and pre-alignment, stage movement for pre-alignment processing can be omitted, thus resulting in an increase in throughput.

In addition, the respective storage times in a plurality of detection systems can be variable, and an image can be captured in the best state for each detection system. Moreover, an image can be captured without driving an actuator such as an ND filter, thus achieving improvement in measurement precision and reduction in measurement time.

Simultaneous image capture by a plurality of detection systems is enabled. Consequently, when the feed shift amount of a wafer falls within the tolerance, the position detection result obtained using images captured simultaneously by a plurality of high-magnification detection systems can be utilized, thereby reducing the alignment measurement time. According to the third embodiment, even if the feed shift amount of the wafer falls outside the tolerance, the light quantity in a region to be measured at a high magnification can be obtained using an image captured by a low-magnification detection system, and setting of the image capture storage time of the high-magnification detection system can be completed before movement for high-magnification measurement is complete. This contributes to a reduction in the alignment measurement time.

Additionally, the movement amount of a stage can be corrected using the rotational component θ, magnification component Mag, shift X, and shift Y. This movement amount of the stage is used to feed, to the measurement position of a high-magnification detection system, marks (FXY3 and FXY4) to be detected at a high magnification on the basis of the result of marks (FXY1 and FXY2 in the first and second embodiments) detected simultaneously at low and high magnifications. For this reason, marks to be detected only at a high magnification can accurately be fed to the high-magnification detection position, and low-magnification detection can be omitted. The rotational component θ is corrected not by performing θ-rotation of the stage but by decomposing the rotational component θ into X and Y components to correct the stage movement amount. This avoids a decrease in throughput due to the θ-rotation.

<Description of a Semiconductor Manufacturing Process>

Figure 15:
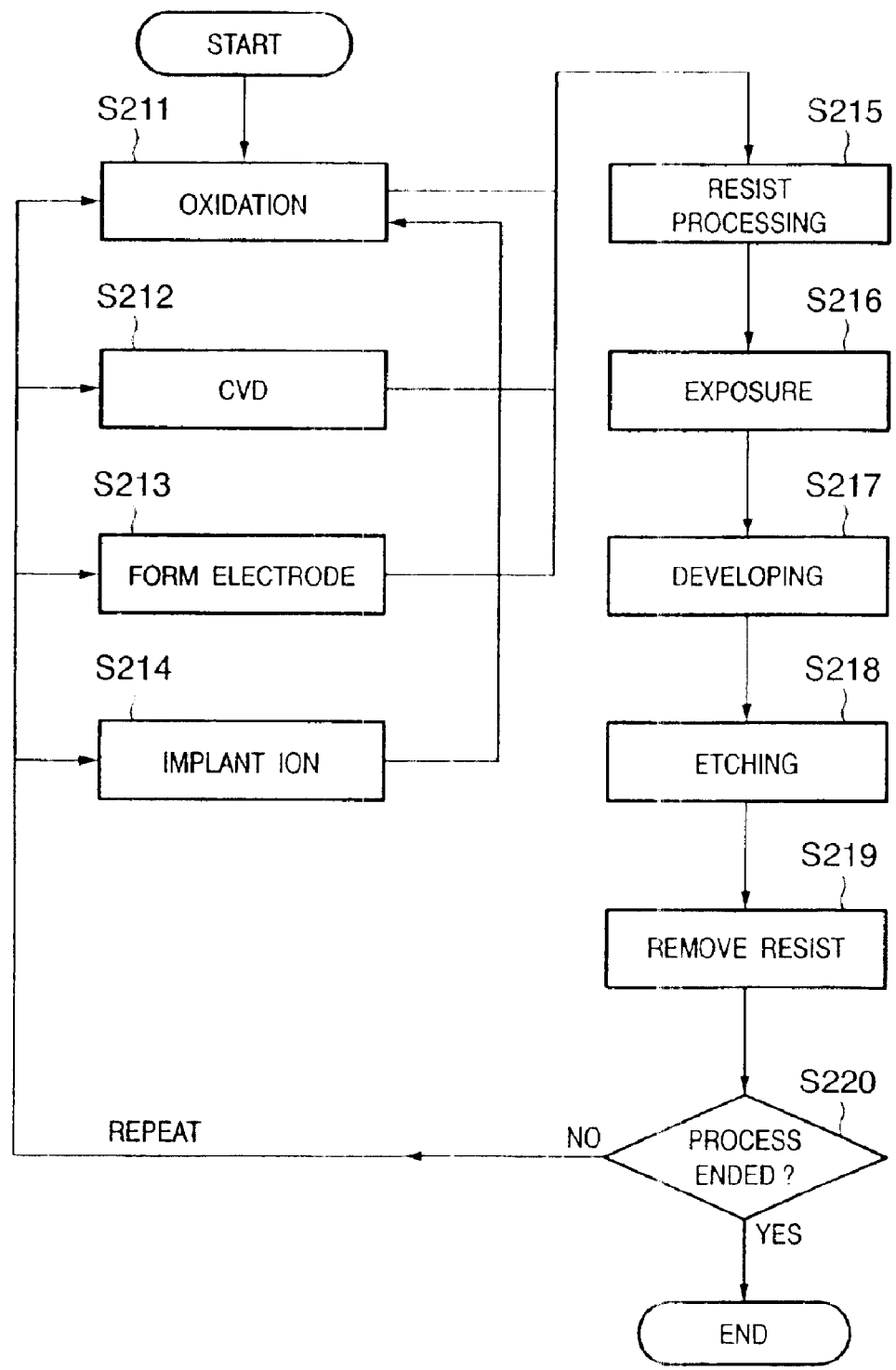
FIG. 15 is a flow chart showing the flow of the whole manufacturing process of a semiconductor device.

A semiconductor device manufacturing process using the above-described exposure apparatuses will be explained. FIG. 15 shows the flow of the whole manufacturing process of the semiconductor device. In step S201 (circuit design), a semiconductor device circuit is designed. In step S202 (mask formation), a mask having the designed circuit pattern is formed. In step S203 (wafer formation), a wafer is formed by using a material such as silicon.

In step S204 (wafer process), called a pre-process, an actual circuit is formed on the wafer by lithography using the prepared mask and wafer. Step S205 (assembly), called a post-process, is the step of forming a semiconductor chip by using the wafer formed in step S204, and includes an assembly process (dicing and bonding) and a packaging process (chip encapsulation). In step S206 (inspection), the semiconductor device manufactured in step S205 undergoes inspections such as an operation confirmation test and a durability test. After these steps, the semiconductor device is completed and shipped (step S207).

The pre-process and post-process are performed in separate dedicated factories, and each of the factories receives maintenance by the above-described remote maintenance system. Information for production management and apparatus maintenance is communicated between the pre-process factory and the post-process factory via the Internet or dedicated network.

Figure 16:
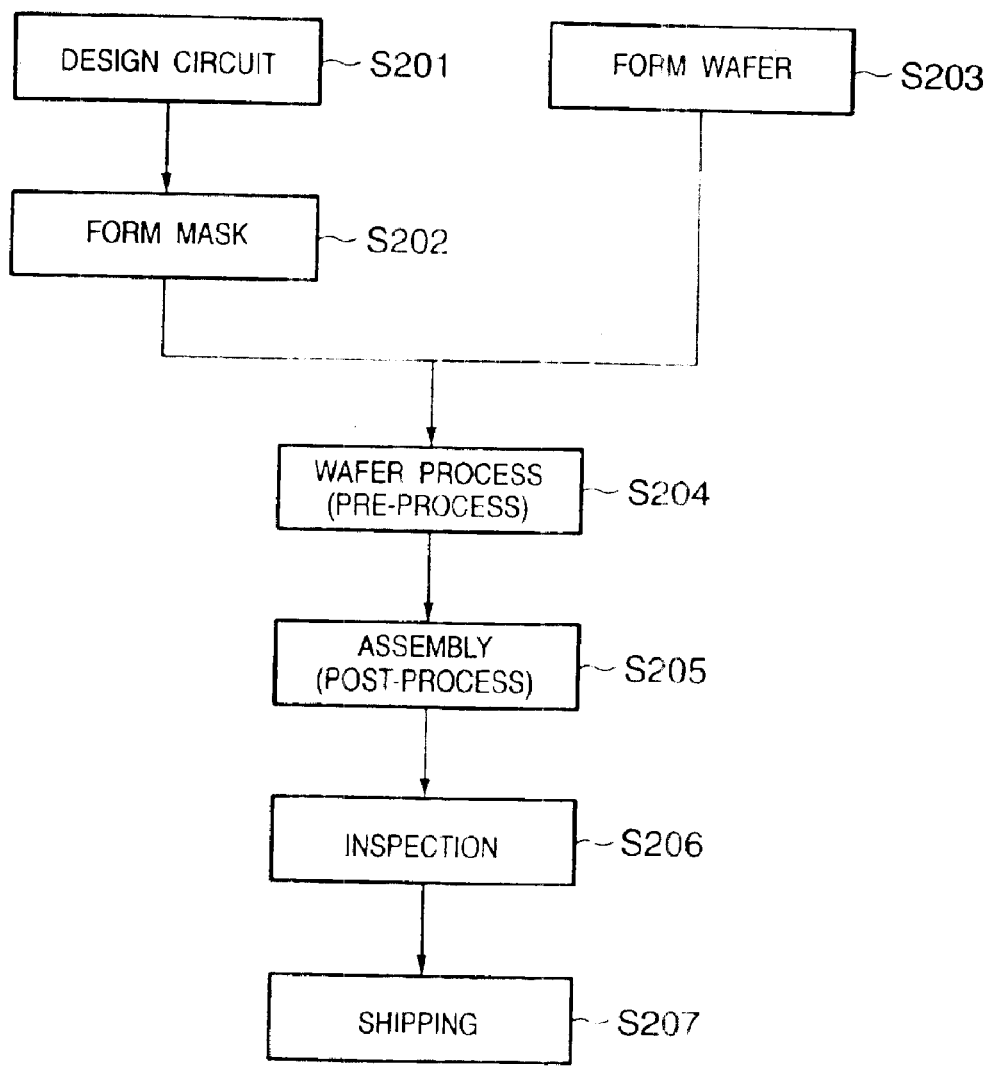
FIG. 16 is a flow chart showing the detailed flow of the wafer process of FIG. 15.

FIG. 16 shows the detailed flow of the wafer process. In step S211 (oxidation), the wafer surface is oxidized. In step S212 (CVD), an insulating film is formed on the wafer surface. In step S213 (electrode formation), an electrode is formed on the wafer by vapor deposition. In step S214 (ion implantation), ions are implanted in the wafer. In step S215 (resist processing), a photosensitive agent is applied to the wafer. In step S216 (exposure), the above-mentioned X-ray exposure apparatus exposes the wafer to the circuit pattern of a mask, and prints the circuit pattern on the wafer. In step S217 (developing), the exposed wafer is developed. In step S218 (etching), the resist is etched except for the developed resist image. In step S219 (resist removal), an unnecessary resist after etching is removed.

These steps are repeated to form multiple circuit patterns on the wafer.

As many apparently widely different embodiments of the present invention can be made without departing from the spirit and scope thereof, it is to be understood that the invention is not limited to the specific embodiments thereof except as defined in the claims.

What is claimed is:

1. A position detection apparatus which detects a position of a pattern, comprising:
    a first sensing system which senses a first image of the pattern at a first magnification;
    a second sensing system which senses a second image of the pattern at a second magnification higher than the first magnification; and
    a determination system which determines whether a relative position between said second sensing system and the pattern is valid for detecting a position of the pattern based on the first image sensed by said first sensing system.

2. An apparatus according to claim 1, further comprising a control system which controls said first and second sensing systems to sense respective images simultaneously.

3. An apparatus according to claim 1, further comprising a first detection system which detects a position of the pattern based on the first image sensed by said first sensing system,
    wherein said determination system determines whether the relative position is valid based on the position detected by said first detection system.

4. An apparatus according to claim 2, further comprising a first detection system which detects the position of the pattern based on the first image sensed by said sensing system,
    wherein said determination system determines whether the sensed image sensed by said second sensing system is valid based on the position detected by said first detection system.

5. An apparatus according to claim 1, further comprising a second detection system which detects a position of the pattern based on the second image sensed by said second sensing system.

6. An apparatus according to claim 2, further comprising a second detection system which detects a position of the pattern based on the second image sensed by said second sensing system,
    wherein the position detected by said second detection system is validated if said determination system determines that the relative position is valid.

7. An apparatus according to claim 1, further comprising an aligning system which aligns the pattern with said second sensing system based on the first image sensed by said first sensing system if said determination system determines that the relative position is not valid.

8. An apparatus according to claim 3, herein said determination system determines that the relative position is valid if the position detected by said first detection system falls within a range.

9. An apparatus according to claim 1, wherein said first and second sensing systems respectively have first and second photoelectric conversion elements whose storage times can be set, and further comprising a setting system which sets the storage times of said first and second photoelectric conversion elements based on the first and second images sensed by said first and second sensing systems, respectively.

10. An apparatus according to claim 1, wherein said first and second sensing systems respectively have first and second photoelectric conversion elements whose storage times can be set, and further comprising a setting system which sets the storage times of said first and second photoelectric conversion elements based on a first image sensed by said first sensing system.

11. An apparatus according to claim 1, wherein said first and second sensing systems have a common objective optical unit.

12. A positioning apparatus which positions a substrate on which a plurality of alignment marks are formed, comprising:
    a first sensing system which senses a first image of the alignment marks at a first magnification;
    a second sensing system which senses a second image of the alignment marks at a second magnification higher than the first magnification;
    a determination system which determines whether a relative position between said second sensing system and the alignment marks is valid for detecting a position of the alignment marks, based on the first image sensed by said first sensing system;
    a detection system which detects a position of the alignment marks based on the second image; and
    a positioning system which positions the substrate based on positions of the plurality of alignment marks detected by said detection system.

13. An apparatus according to claim 12, further comprising a second positioning system which positions an alignment mark based on positions of a plurality of the alignment marks detected by said detection system.

14. A position detection method of detecting a position of a pattern, comprising steps of:
    sensing, in a first sensing step, a first image of the pattern at a first magnification using a first sensing system;
    sensing, in a second sensing step, a second image of the pattern at a second magnification higher than the first magnification using a second sensing system; and
    determining whether a relative position between the second sensing system and the pattern is valid for detecting a position of the pattern, based on the first image sensed in said first sensing step.

15. A method according to claim 14, further comprising a step of controlling the first and second sensing systems to sense respective images simultaneously.

16. A method according to claim 14, further comprising a detection step of detecting a position of the pattern based on the first image sensed in said first sensing step,
    wherein said determination step determines whether the relative position is valid based on the position detected in said detection step.

17. A method according to claim 15, further comprising a detection step of detecting a position of the pattern based on the first image sensed in said first sensing step,
    wherein said determination step determines whether the second image is valid based on the position detected in said detection step.

18. A method according to claim 14, further comprising a detection step of detecting a position of the pattern based on the second image sensed in said second sensing step.

19. A method according to claim 14, further comprising a detection step of detecting a position of the pattern based on the second image sensed in said second sensing step,
wherein the position detected in said second detection step is validated if said determination step determines that the relative position is valid.

20. A method according to claim 14, further comprising a step of aligning the pattern with the second sensing system based on the first image if said determination step determines that the relative position is not valid.

21. A method according to claim 16, wherein said determination step determines that the relative position is valid if the position detected in said detection step falls within a range.

22. A method according to claim 14, wherein the first and second sensing systems respectively have first and second photoelectric conversion elements whose storage times can be set, and further comprising a step of setting the storage times of the first and second photoelectric conversion elements based on the first and second images sensed in said first and second sensing steps, respectively.

23. A method according to claim 14, wherein the first and second sensing systems respectively have first and second photoelectric conversion elements whose storage times can be set, and further comprising a step of setting the storage times of the first and second photoelectric conversion elements based on the first image sensed in said first sensing step.

24. A method according to claim 14, wherein the first and second sensing systems have a common objective optical unit.

25. A positioning method of positioning a substrate on which a plurality of alignment marks are formed, comprising steps of:
sensing a first image of the alignment marks at a first magnification using a first sensing system;
sensing a second image of the alignment marks at a second magnification higher than the first magnification using a second sensing system;
determining whether a relative position between the second sensing system and the alignment marks is valid for detecting a position of the pattern, based on the first image sensed in said first sensing step;
detecting a position of the alignment marks based on the second image; and
positioning the substrate based on positions of the alignment marks detected in said detection step.

26. A method according to claim 25, further comprising a step of positioning an alignment mark based on positions of a plurality of the alignment marks detected in said detection step.

27. An exposure apparatus comprising:
a positioning apparatus as claimed in claim 12; and
an exposure system which exposes a substrate, positioned by said positioning apparatus, to a pattern.

28. A device manufacturing method comprising steps of:
positioning a substrate using a positioning apparatus as claimed in claim 12; and
exposing the substrate, positioned in said positioning step, to a pattern.

* * * * *